US012593634B2

(12) United States Patent
Kanaki et al.

(10) Patent No.: US 12,593,634 B2
(45) Date of Patent: Mar. 31, 2026

(54) SELECTIVE GAS PHASE ETCH OF SILICON GERMANIUM ALLOYS

(71) Applicant: TOKYO ELECTRON LIMITED, Tokyo (JP)

(72) Inventors: Toshiki Kanaki, Albany, NY (US); Subhadeep Kal, Albany, NY (US); Aelan Mosden, Albany, NY (US); Ivo Otto, IV, Albany, NY (US); Masashi Matsumoto, Hillsboro, OR (US); Shinji Irie, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 56 days.

(21) Appl. No.: 17/967,298

(22) Filed: Oct. 17, 2022

(65) Prior Publication Data

US 2024/0128088 A1     Apr. 18, 2024

(51) Int. Cl.
*H01L 21/3065* (2006.01)
*H01L 21/02* (2006.01)
*H01L 21/306* (2006.01)

(52) U.S. Cl.
CPC .... *H01L 21/30621* (2013.01); *H01L 21/0245* (2013.01); *H01L 21/02472* (2013.01)

(58) Field of Classification Search
CPC ...................... H01L 21/02019; H01L 21/3065
See application file for complete search history.

(56) References Cited

U.S. PATENT DOCUMENTS

| | | | |
|---|---|---|---|
| 8,389,416 | B2 | 3/2013 | Luong |
| 10,529,581 | B2 | 1/2020 | Hsu et al. |
| 10,971,372 | B2 | 4/2021 | Kal et al. |
| 2015/0126040 | A1* | 5/2015 | Korolik ............ H01J 37/32357 438/718 |
| 2017/0323795 | A1 | 11/2017 | Li et al. |
| 2020/0020689 | A1* | 1/2020 | Ohtou .................. H10D 62/121 |
| 2020/0027741 | A1 | 1/2020 | Kal et al. |
| 2020/0066894 | A1* | 2/2020 | Frougier ............. H01L 29/0847 |
| 2020/0105539 | A1* | 4/2020 | Takahashi ......... H01L 21/67161 |
| 2023/0027676 | A1* | 1/2023 | Kuang ............ H01L 21/823412 |
| 2023/0215768 | A1* | 7/2023 | Xie ...................... H10D 62/118 |

FOREIGN PATENT DOCUMENTS

WO     2021181613 A1     9/2021

OTHER PUBLICATIONS

International Search Report and Written Opinion, PCT Application No. PCT/US2023/032157, mailed Dec. 27, 2023, 11 pages.

* cited by examiner

*Primary Examiner* — Thomas T Pham
(74) *Attorney, Agent, or Firm* — Slater Matsil, LLP

(57) ABSTRACT

Methods for selective etching of one layer or material relative to another layer or material adjacent thereto. In an example, a SiGe layer is etched relative to or selective to another silicon containing layer which either contains no germanium or geranium in an amount less than that of the target layer.

20 Claims, 4 Drawing Sheets

S10 — Remove Oxide Layer

S12 — Gas Phase Etch
halogen gas
carbon gas

S14 — Heat Treatment

SELECTIVE GAS PHASE ETCH OF SILICON GERMANIUM ALLOYS

FIELD OF THE INVENTION

The invention relates to processing of substrates, and particularly to selective etching of materials or layers of a substrate.

BACKGROUND

In various types of semiconductor architectures, selective etching of adjacent layers or materials is needed. In an example, the selective etching is of a silicon germanium alloy (SiGe) target layer with respect to another layer which includes silicon (Si, without germanium) or SiGe (with a different alloy amount of Ge compared to the SiGe target layer being etched). Current methods can be unsatisfactory in that byproducts of the etching can be reactive with the layers for which etching is not desired, and therefore, it is difficult to achieve the desired selectivity and/or control of the selectivity.

SUMMARY

The invention of provides selective etching of two different materials, for example, two silicon containing materials, where at least one of the materials also includes germanium (SiGe). In preferred examples, the target layer (the layer desired be etched) includes SiGe, and the target layer is etched with respect to (or selective to) a silicon layer which does not include germanium, or which includes germanium in an alloy amount less than that of the target layer.

In a preferred example, the etching is a gas phase etch which is not in a plasma environment, and a carbon containing gas is added to the gas chemistry. The carbon containing gas reacts with byproducts of the etchant gas, so that the byproducts do not react (or reaction is reduced) with the layer which is not desired to be etched.

In an example, when an oxide layer is present on the materials or layers being processed, preferably an oxide removal step is performed prior to the etching. In addition, preferably a heat treatment is performed after etching to remove byproducts.

In an example, the etch is performed in an indent process so that the target layer is indented with respect to an adjacent layer. In another example, the invention can be used in a channel release, where the target layer being etched is a layer between channels of a device structure, for example, a gate stack, and the layer which is not being etched is left to form channels of a gate structure. It is to be understood that processes disclosed herein could also be utilized in other etching applications.

BRIEF DESCRIPTION OF THE DRAWINGS

The invention will be better appreciated and understood with reference to the detailed description herein in conjunction with the drawings in which.

DETAILED DESCRIPTION

The invention will be further appreciated according to the description of exemplary embodiments and advantages herein. It is to be understood that not every aspect of a particular example need be utilized to practice the invention, and therefore, a subset of features of particular examples could be utilized without utilizing other aspects. Similarly, advantages that can be achieved with the invention are also described herein, however, in practicing the invention, certain aspects or advantages may be utilized without others, or alternate advantages can be achieved.

Certain examples are described herein as not including an element or a material. This is to be understood to mean that the element or material is not intentionally present or introduced. However, trace amounts of such elements or materials could be present depending upon the purity of materials used.

In examples disclosed herein, selective etching is provided for one silicon containing layer (a target layer which is desired to be etched) with respect to another silicon containing layer, where the materials are different from each other. Preferably, at least one of the layers includes germanium and the other layer or second layer either does not include germanium or includes germanium in an amount less than that of the first layer or target layer. For example, the target layer can include SiGe, and the layer for which etching is not desired can include silicon without any germanium present, or can include SiGe where the amount of germanium in the layer for which etching is not desired is lower than that of the target layer. For example, the SiGe target layer could include 25% germanium, and the layer for which etching is not desired could be poly-silicon or amorphous silicon, by way of example. Alternately, the target layer could include germanium in an amount of 20% or greater than 20%, whereas the layer for which etching is not desired could include germanium in a lower alloying amount of 20% or lower than 20%, for example, less than 5%. According to an example, the target layer could include SiGe, with 25% or more germanium. As a further alternative, the target layer could include SiGe with an amount of germanium greater than 30% or, for example, greater than 50% germanium, with the layer for which etching is not desired, having a germanium content lower than a 30%, for example, less than 20%, for example, having less than 5% germanium or including no germanium.

Figures 1A, 1B, 1C:
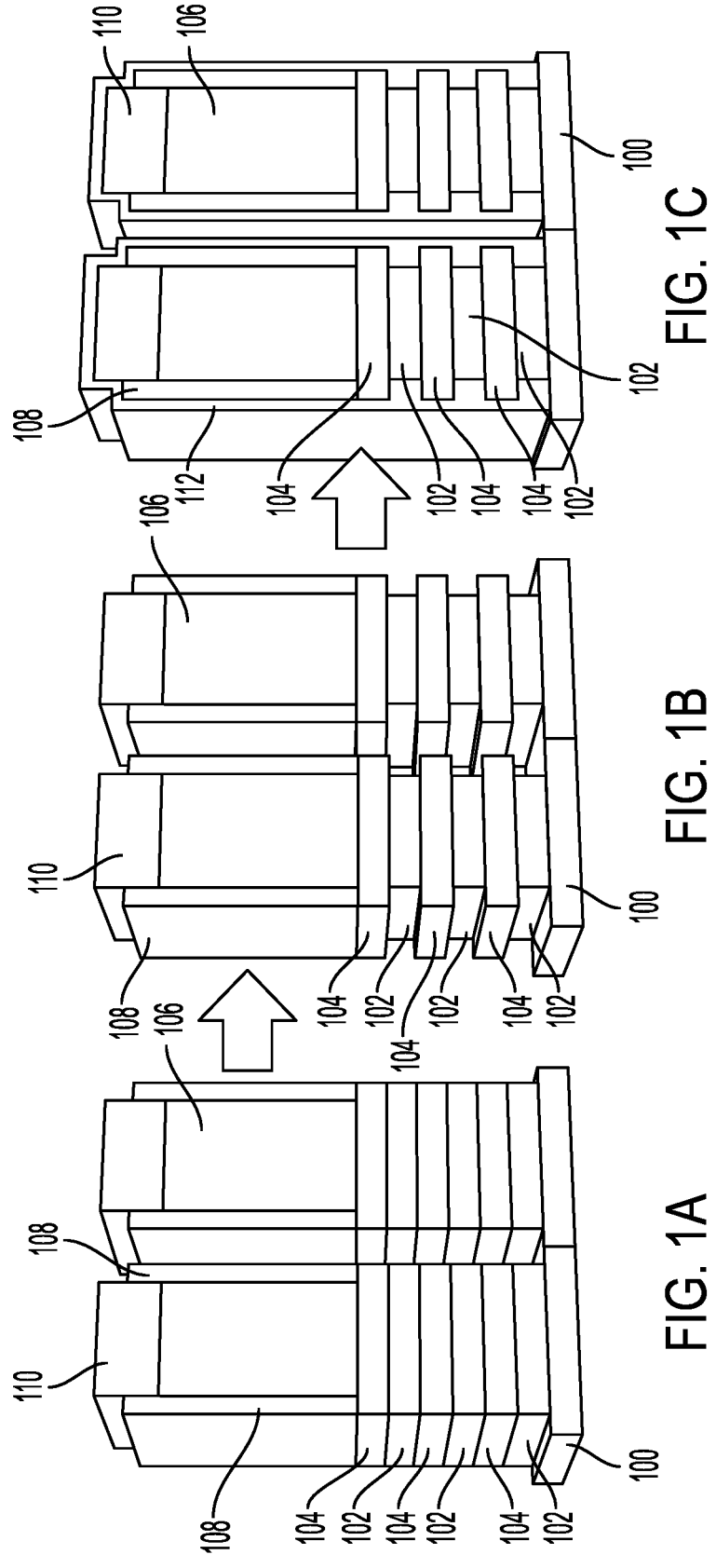
FIGS. 1A-1C illustrate a selective etching example using methods disclosed herein.

FIGS. 1A-1C illustrate an etching sequence for an indent process which can be performed with examples of the present methods. In the devices of FIG. 1A, a base 100 is provided which can include a semiconductor wafer base, as well as additional layers below the layers being processed as discussed herein. Above the base 100, layers are stacked in an alternating fashion to provide a gate stack, with the stacked layers including at least two different layers of different material compositions. For example, in the illustrated arrangement, a plurality of first layers 102 are formed as the target layer or layer to be etched with respect to the second layers 104. In an example, the layers 102 include silicon and germanium, whereas the layers 104 include silicon with either no germanium or with a germanium alloy amount lower than that of the layers 102. As a further alternative or control, one of the layers can be doped, for example, with boron. For example, in the example, the target layer 102 can be doped with boron.

Due to the environment in which the device is present prior to processing, the layers 102, 104 may have an oxide layer thereon, such as a native oxide layer. Preferably, an oxide removal step is performed prior to etching. An oxide layer might also be present as a result of previous processing.

In the oxide removal, an oxide etch is performed, preferably with a halogen containing gas. For example, the removal of the oxide can be with HF and/or $NH_3$. In an alternative, the removal could be performed with a treatment gas which includes fluorine and oxygen, or a fluorine containing gas and a hydroxyl-containing gas (e.g., $H_2O$). Typically, a carrier gas such as Ar and/or N2 are also present. The oxide removal could be performed as an etch process which removes the oxide in one step. Alternately, the oxide removal could be performed in two steps, in which the oxide is first treated with a treatment gas, to form a modified oxide surface on the layers 102 and/or 104, which is then removed in a heat treatment or sublimation process. In an example, the oxide layer can be removed with etchant gases which include HF and $NH_3$.

After oxide removal, an indent etch is performed to provide a substrate as illustrated in FIG. 1B, in which the target layer 102 has been indented with respect to the layer 104. In etching target layers 102 which include silicon and germanium, a halogen containing gas and a carrier gas (such as Ar and/or N2) can be used. However, in accordance with an aspect of the present methods, it has been recognized that byproducts of such an etching gas chemistry can etch the layers (e.g., 104) for which etching is not desired. For example, where a process gas for etching includes fluorine to etch layer 102, byproducts can include SiF4 and/or GeF4, and such byproducts can react with and etch layer 104. In accordance with an aspect of the invention, some or all of the carrier gas is replaced with a carbon containing gas, and the carbon containing gas will react with byproducts resulting from etching of layer 102 ($SiF_4$ and $GeF_4$) to provide more complex molecules resulting from the combination of the byproducts and the carbon containing gas, so that the more complex molecules will not react with the layer 104 (or so that there is reduced or minimal reaction).

In an example, the etch to provide the indent from FIG. 1A to 1B, where an outer dimension of the layer 102 is indented to have a smaller outer dimension than the outer dimension of layer 104, a non-plasma gas phase etch is used. The processing temperature can be, for example, −20° C. to 120° C. In an example of a preferred range, the temperature is from 0° C. to 80° C. The gas chemistry includes at least a halogen containing gas and a carbon containing gas. For example, the gases can include a fluorine and/or a chlorine containing gas, and the carbon containing gas. The gases can include one or more carrier gases, such as Ar and/or N2. According to examples, the halogen or fluorine containing gas is 20%-90% of the volumetric flow rate, preferably 40-80%, and more preferably 50-80% of the total volumetric flow rate. Preferably, the fluorine containing gas is at least 35% of the total volumetric flow rate during the etch. The carbon containing gas can be, for example, 10-50% of the total volumetric flow rate, preferably 10-40%, and more preferably 10-30%. In an example, the carbon containing gas is 10-25% of the volumetric flow rate. In another example, the carbon containing gas is 25-50% of the total volumetric flow rate. The carrier gas is preferably less than 25% of the total volumetric flow rate (nitrogen and/or argon), and more preferably 10-25% of the total volumetric flow rate. Preferably, the percentage of the carrier gas does not exceed the percentage of the carbon containing gas. The pressure can be in a range of from 0.3 mTorr to 300 mTorr, and preferably in a range of 50-150 mTorr.

Where the gas chemistry includes a halogen containing gas such as a fluorine containing gas and a carrier gas, but without a carbon containing gas, undesirable byproducts can be formed, such as $SiF_4$ and/or $GeF_4$. These byproducts can react with the layer 104 to etch the layer 104, and therefore, can reduce the selectivity in etching layer 102 with respect to layer 104 and/or reduce the control of the selectivity. In accordance with examples of methods disclosed herein, the carbon containing gas will react with byproducts such as $SiF_4$ and/or $GeF_4$ to form more complex or larger molecule byproducts which will not react (or will react less) with the layer 104, thereby providing better and more controllable selectivity.

According to an example, the etch environment is anhydrous and a hydrogen containing gas is not introduced during the etching. In addition, by way of example, a metal is not included in the gas chemistry or in one or both of the layers 102, 104. In an example, the target layer 102 is doped with boron, and the layer 104 is not doped.

After the gas-phase etch, preferably a heat treatment is performed, which is performed at a temperature higher than the temperature during the etching. For example, the heat treatment can be performed at a temperature of 100° C. or higher (and higher than the temperature during the etching). The pressure during the heat treatment can be 0.5 Torr to 5 Torr, and preferably 1 Torr-3 Torr, more preferably 1 Torr-2 Torr. The gas environment during the heat treatment can be, for example, 100% nitrogen or a combination of nitrogen and argon, for example. Etchant gases are not present in an example, preferably with no halogen and no oxygen containing gases.

After the heat treatment, as shown in FIG. 1C, a layer 112 can be formed over the devices so that the layer 112 also fills the recesses that were formed by selectively etching layer 102 with respect to layer 104. The spacer material 112 can be, for example, a low-k dielectric, which is formed of a material different from the gate spacers 108 and mask 110. The gate spacers 108 can be, for example, SiN or a low-k dielectric (different from the spacer layer 112). Element 110 is a mask in the illustrated example and can be formed, for example, of $SiO_2$ or SiN, and the mask can be, for example, a hard mask and is also formed of a material different from the layer 112 or the gate spacers 108. In an example, element 106 can be a dummy gate formed of amorphous silicon (a-Si), for example.

Figure 2:
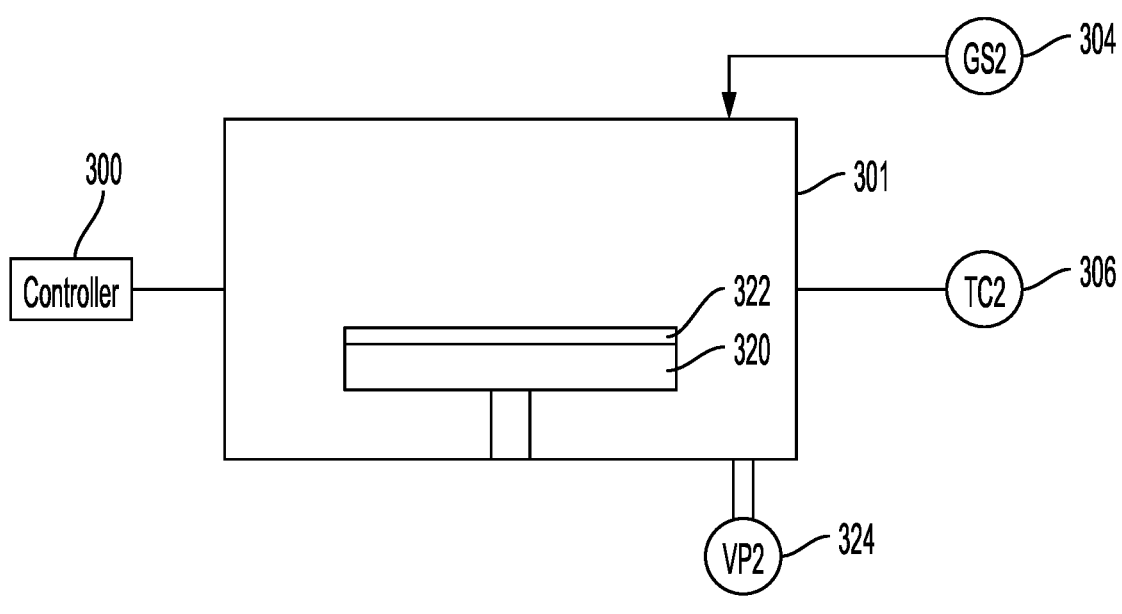
FIG. 2 schematically illustrates a process chamber which can be utilized for one or more processing steps as disclosed herein.

FIG. 2 schematically represents a processing apparatus which can be used to perform one or more process operations as disclosed herein. The apparatus can include a controller 300 which can include, for example, one or more processors or computers, and can also include a memory to store, for example, process commands, recipes, recipe data, substrate data, or other control data. Control information can also be supplied to the controller from another device or memory separate from the controller 300. The control and recipe data are preferably stored in a non-transitory computer-readable medium. It is to be understood that while one controller is identified at 300, the controller can include plural controllers, and/or one or more sub-controllers or separate controllers can be included which operate independently or under commands from the controller 300 to control the various power, gas supply, and temperature control equipment and functions to perform processes as described herein. The gas source GS2 304 can supply gases which are mixed within the chamber 301 or the gases can be mixed upstream from the chamber 301, for example, in a pre-mix chamber or with suitable valves and piping to provide mixing in a conduit upstream from the chamber 301. The gas supply 304 provides a source of at least a halogen or fluorine containing gas and a carbon containing gas, and preferably also one or more carrier gases such as nitrogen and/or argon. The gases can be supplied through common or separate inlets into the chamber 301, and the gases are controllably supplied, e.g., with suitable valving under the control of the controller, to provide the volumetric flow rates as discussed earlier herein. A temperature control is represented at TC2 306 and can include heaters in the substrate support 320 which supports a substrate 322. The heaters can be electric and/or fluidic heaters which provide for heating and/or cooling and/or heat exchange, controlled to provide the desired temperature. In addition, or alternatively, the temperature control TC2 can provide heating within the chamber walls of chamber 301, and/or with radiant heating devices, for example. Gases are exhausted by a vacuum pump VP2 324, and the combined control of the gases fed to the chamber 301 and gases exhausted can also control the pressure. The substrate support 320 can also include suitable devices for holding the substrate, for example, with an electrostatic chuck. Because the gas phase etch is in a non-plasma environment, electrodes and power sources are not needed for generating a plasma. However, processes as disclosed herein could also be performed in equipment which includes one or more electrodes and power sources connected thereto (e.g., RF or radio frequency, inductive, or microwave power sources) so as to be capable of generating a plasma within the chamber, or alternatively, in connection with an arrangement in which a remote plasma is generated in a separate chamber and plasma is then fed to the chamber. Although a non-plasma etch is preferred, a plasma etch could be used. Each of the main processing operations described herein, including the oxide removal, the etching, and the post-etching heat treatment could be performed in the same chamber. However, the operations could also be formed in two chambers or three chambers. For example, the heat treatment could be performed in a chamber that is particularly designed for heat treatment at higher temperatures, so that the heat treatment is performed in a chamber separate from that used for the etching. It is to be understood that the apparatus of FIG. 2 is provided as an example, and modifications and variations are possible.

Figure 3:
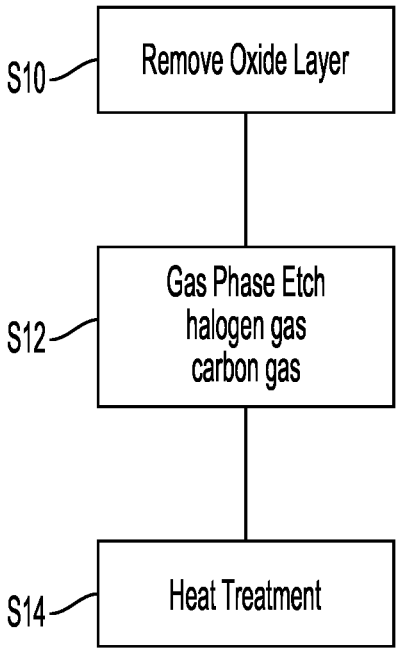
FIG. 3 is a flow chart or algorithm of a selective etching example.

FIG. 3 is a flow chart or algorithm which can be implemented by, for example, a controller 300 as discussed earlier, and provides an overview of the process steps as described herein. In a first step S10, an oxide layer is removed. If no oxide layer is present, this step can be eliminated. In step S12, a gas phase etch is performed using a halogen (preferably fluorine) containing gas and a carbon containing gas, and typically also a carrier gas such as argon and/or nitrogen. Process conditions and flow rates are controlled as discussed earlier. Thereafter, a heat treatment is performed as indicated at S14, with the process conditions controlled as discussed earlier.

Figures 4A, 4B, 4C:
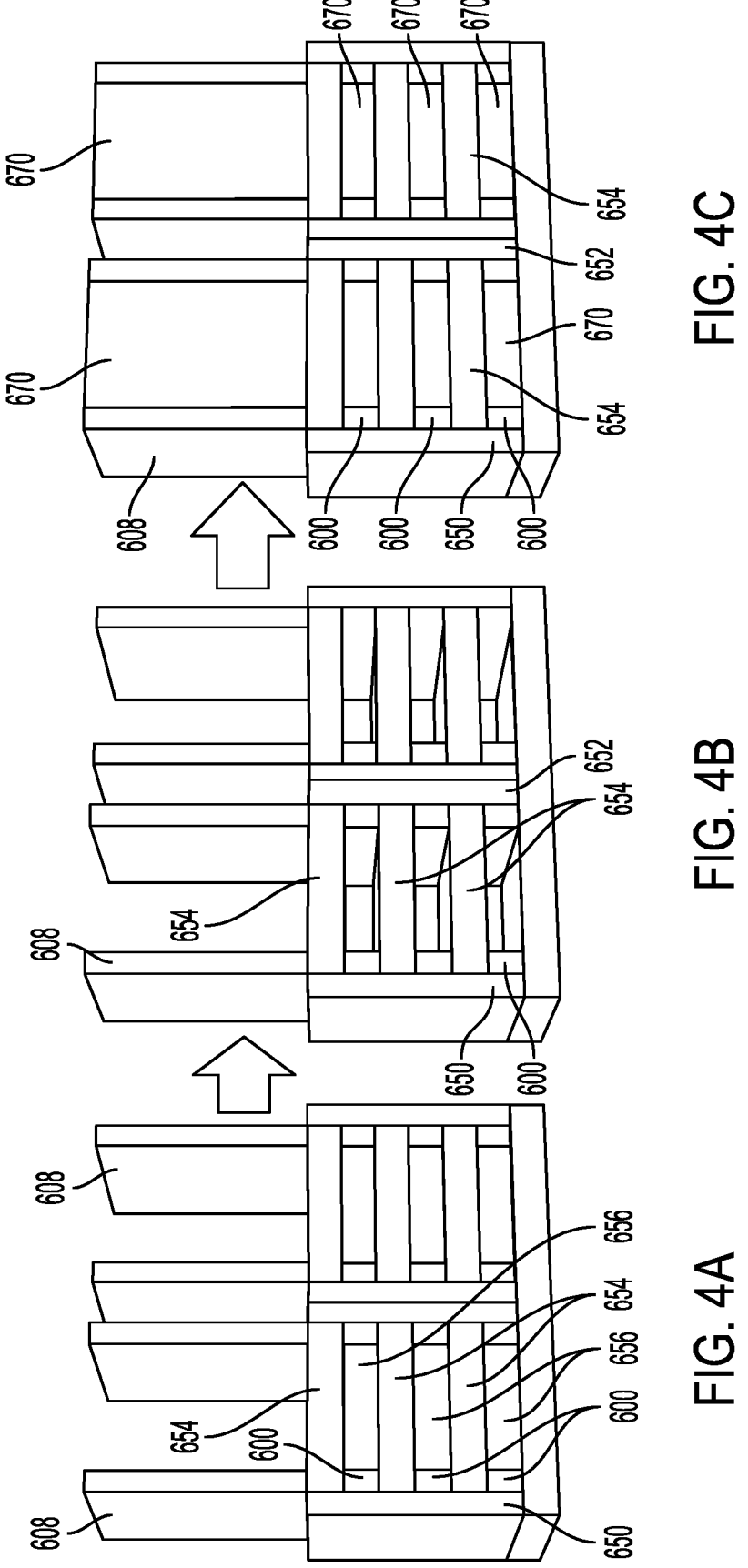
FIGS. 4A-4C illustrate another selective etching example using methods disclosed herein.

Referring now to FIGS. 4A-4C, another example of an etching operation to which the present methods can be applied is illustrated. In FIG. 4A, layer 656 is a target layer to be etched and completely removed. Target layer 656 can be formed, for example, of silicon and germanium (SiGe). The layer 654 is formed of a material which includes silicon and either no germanium or germanium in an amount less than that of layer 656. The layer 654 will thus form a channel structure in a completed device. The channels 654 extend from the source 650 to the drain 652. Prior to removal, the channels are separated by target layers 656, which are to be removed selective to the channel layers 654. The oxide removal step can be omitted if an oxide layer is not present on the layers 654, 656. However, if an oxide layer is present, the oxide removal can also be performed.

In the initial structure of FIG. 4A, spacers 600 are provided which can be formed, for example, of a layer of a dielectric material (e.g., as illustrated at 112 in FIG. 1C), with the layer 112 then etched back to leave spacers 600 in the indentations of layers 656 and adjacent the layers 654. In this example, the layers 656 are formed of SiGe, and the layers 654 are formed of a silicon containing material which either contains no Ge or which includes Ge in an amount less than that of layers 656. Alloy amounts can be as disclosed earlier herein.

Thus, an etching process can be performed as was utilized in performing the indent process described earlier, with process gases including a fluorine containing gas, a carbon containing gas, and typically also a carrier gas which includes argon and/or nitrogen. Conditions can be as described earlier. Typically, the pressure would be at higher portions of the pressure ranges discussed earlier, and the duration of the etching would be longer, so that the etching entirely removes the layer 656 to provide a channel release, with the channel released as illustrated in FIG. 4B.

After the channel release, a gate metal 670 can be deposited between the gate spacers 608, and also in the regions previously occupied by layers 656.

Thus, methods as described herein can be utilized to perform a channel release in removing a SiGe layer selective to a silicon containing layer, where the channel 654 includes either no germanium or germanium in an amount less than that of the target layer 656 to be removed. The use of a carbon containing gas is particularly advantageous in avoiding or reducing byproducts which could undesirably etch channels 654.

Although examples of methods and applications are described herein, the present methods could be utilized in other applications in etching layers of a gate stack, or in alternate devices. Methods as described herein could be utilized in various structures including but not limited to nfet, pfet, nanosheet, GAA, finfet, CFET, and other devices or device features.

It is to be understood that modifications and variations can be incorporated consistent with the teachings herein. It is therefore to be understood that within the scope of the present claims, the invention can be practiced otherwise or with variations with respect to the examples disclosed herein.

The invention claimed is:
1. An etching method free of plasma generation, the method comprising:
   providing a substrate having a plurality of first layers alternating with a plurality of second layers, each of the first layers including silicon and germanium, each of the second layers including silicon and either no germanium or germanium in an amount lower than the first layers; and
   selectively etching the first layers relative to the second layers by a process comprising: etching the first layers with a gas chemistry which includes a halogen containing gas and a carbon containing gas to etch the first layers with respect to the second layers, wherein the etching is a non-plasma gas phase etch.
2. The method according to claim 1, wherein the etching is performed at a temperature in a range of from −20° C. to 130° C.

3. The method according to claim 2, wherein the first and second layers are vertically stacked.

4. The method according to claim 3, wherein the etching indents the first layers with respect to the second layers so that an outer dimension of the first layers is smaller than an outer dimension of the second layers.

5. The method according to claim 3, wherein the second layers are channels in a gate stack and the etching removes the first layers in a channel release.

6. The method of claim 3, further comprising, prior to the etching, removing a native oxide layer from the first layers and the second layers.

7. The method according to claim 1, wherein the first layers each have germanium in an alloy amount of 20% or greater, and the second layers each either have no germanium or have 5% or less germanium.

8. The method according to claim 1, wherein the first layers each have germanium in an alloy amount of 20% or higher, and the second layers each have either no germanium or germanium in an alloy amount of 20% or lower; and wherein during the etching gases are supplied according to volumetric flow rates as follows:

25% or less of a carrier gas, the carrier gas including Ar and/or $N_2$;

10% to 50% of the carbon containing gas; and

35% or more of a fluorine containing gas.

9. The method of claim 8, wherein the etching is performed without introducing a hydrogen containing gas during the etching, the method further including:

after the etching, raising the temperature of the substrate to 100° C. or greater to perform a heat treatment, the heat treatment performed in an environment containing Ar and/or $N_2$ at a pressure in a range from 1 Torr to 3 Torr; and wherein the etching is performed at a temperature of a range of 0° C. to 80° C., and the etching is performed at a pressure in a range from 0.3 mTorr to 300 mTorr.

10. The method according to claim 1, wherein the halogen containing gas is a chlorine containing gas.

11. A method of etching without a remote plasma generation, the method comprising:

providing a substrate having a first layer and a second layer, the first layer adjacent to the second layer, the first and second layers are formed of different materials, and each of the first and second layers comprises silicon, the first and second layers having an oxide layer on side surfaces;

removing the oxide layer from the side surfaces of the first and second layers so that the first layer has a first exposed side surface and the second layer has a second exposed side surface; and etching the first exposed side surface relative to the second exposed side surface so that an outer dimension of the first layer is smaller than an outer dimension of the second layer, and wherein the etching is performed with a fluorine containing gas and a carbon containing gas, the fluorine containing gas being configured to react with the first layer, the carbon containing gas being configured to react with byproducts resulting from the etching, wherein the etching is a non-plasma gas phase etch.

12. The method according to claim 11, wherein the carbon containing gas reacts with at least one of $SiF_4$ or $GeF_4$.

13. The method according to claim 12, wherein:

the first layer is formed of a material which includes silicon and germanium;

the second layer is formed of a material which includes silicon and either no germanium or germanium in an amount less than the first layer; and the etching is performed with the fluorine containing gas at a temperature in a range from −20° C. to 120° C.

14. The method according to claim 11, wherein the first layer is formed of a material which includes silicon and germanium, and the second layer is formed of a material which includes silicon and either no germanium or germanium in an amount lower than the first layer.

15. The method according to claim 11, wherein the etching is performed at a temperature in a range from 0° C. to 80° C., and a pressure in a range from 0.3 mTorr to 300 mTorr, and the etching is a gas phase non-plasma etch in an environment in which a hydrogen containing gas is not introduced, and wherein volumetric flow rates of gases introduced into the environment during the etching include:

25% or less of a carrier gas comprising Ar and/or $N_2$;

10%-50% of the carbon containing gas, and wherein the percentage of carrier gas does not exceed the percentage of the carbon containing gas; and 35% or more of the fluorine containing gas; and the method further including performing a heat treatment after the etching, wherein the heat treatment is at a temperature of at least 100° C., a pressure in a range of 1 Torr to 3 Torr and in an environment containing nitrogen and/or argon and without introducing a halogen containing gas.

16. A method of etching without a remote plasma generation, the method comprising:

providing a substrate having devices which each include a plurality of first layers and a plurality of second layers; and etching the plurality of first layers selectively to the plurality of second layers, wherein the etching is performed in a gas phase, non-plasma environment, the etching is performed with a fluorine containing gas and a carbon containing gas, during the etching, byproducts are formed which can etch the second layers; layers, and the carbon containing gas reacting with the byproducts to prevent the byproducts from etching the second layers, the fluorine containing gas being configured to react with the first layers.

17. The method according to claim 16, wherein the etching is performed in an environment including the following gas flow rates:

10-25% of a carrier gas including Ar and/or $N_2$;

10% to 50% of the carbon containing gas; and

20% or more of the fluorine containing gas.

18. The method according to claim 17, wherein the first and second layers are layers part of gate stack structures, and the etching performs one of: an indent to indent sides of the first layers with respect to sides of the second layers, or a channel release to remove the first layers wherein the second layers form channels.

19. The method according to claim 18, wherein the first layers include silicon and germanium, and the second layers include silicon, the second layers including either no germanium or germanium in an amount less than the first layers.

20. The method according to claim 19, wherein the first layers are doped with boron and the second layers are not doped with boron.

* * * * *